United States Patent
Yasunami et al.

(10) Patent No.: US 6,746,813 B2
(45) Date of Patent: Jun. 8, 2004

(54) NEGATIVE RESIST COMPOSITION

(75) Inventors: Shoichiro Yasunami, Shizuoka (JP); Yutaka Adegawa, Shizuoka (JP); Koji Shirakawa, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/396,583

(22) Filed: Mar. 26, 2003

(65) Prior Publication Data

US 2003/0203305 A1 Oct. 30, 2003

(30) Foreign Application Priority Data

Mar. 29, 2002 (JP) ..................... P.2002-096410

(51) Int. Cl.⁷ .............................. G03F 7/004
(52) U.S. Cl. .................. 430/170; 430/270.1; 430/905
(58) Field of Search ............... 430/170, 270.1, 430/905

(56) References Cited

U.S. PATENT DOCUMENTS 6,338,931 B1 * 1/2002 Maeda et al. ............... 430/170
6,395,446 B1 * 5/2002 Seki et al. .................. 430/170
6,440,634 B1 * 8/2002 Ohsawa et al. .......... 430/270.1
6,512,020 B1 * 1/2003 Asakura et al. ............... 522/57
2003/0180653 A1 * 9/2003 Ohsawa et al. ............ 430/170
2003/0215738 A1 * 11/2003 Ohsawa et al. .......... 430/270.1

FOREIGN PATENT DOCUMENTS

| EP | 1 117 002 A1 | 7/2001 |
| JP | 2-253262 A | 10/1990 |
| JP | 2-962145 B2 | 8/1999 |

\* cited by examiner

*Primary Examiner*—John S. Chu
(74) *Attorney, Agent, or Firm*—Sughrue Mion, PLLC

(57) ABSTRACT

A negative resist composition comprising (A-1) an alkali-soluble resin containing a repeating unit represented by formula (1) defined in the specification, (A-2) an alkali-soluble resin containing a repeating unit represented by formula (2) defined in the specification, (B) a crosslinking agent crosslinking with the alkali-soluble resin (A-1) or (A-2) by the action of an acid, (C) a compound that generates an acid upon irradiation of an actinic ray or radiation, and (D) a nitrogen-containing basic compound.

10 Claims, No Drawings

NEGATIVE RESIST COMPOSITION

FIELD OF THE INVENTION

The present invention relates to a negative resist composition suitably used in an ultra-micro lithography process, for example, the production of VLSI and high capacity microtips, and other fabrication processes. More particularly, it relates to a negative resist composition capable of forming high precision patterns using radiation, particularly, an electron beam or an X ray.

BACKGROUND OF THE INVENTION

In processes for the production of semiconductor devices, for example, IC or LSI, fine fabrication has been conducted by means of lithography using a photoresist composition. In recent years, as the degree of integration increases in integrated circuits, it has been desired to form an ultra fine pattern in a submicron region or a quarter micron region. With such a trend, an exposure wavelength tends to become shorter such as from g-line to i-line or a KrF excimer laser beam. Further, the development of lithography using an electron beam or an X ray as well as the excimer laser beam also proceeds at present.

The electron beam lithography is regarded as the next generation pattern formation technique or the pattern formation technique after the next generation, and thus the development of a negative resist having high sensitivity and high resolution has been strongly desired. For the purpose of shortening the time for wafer process, it is a very important subject to increase the sensitivity of resist. In the negative resist for an electron beam, however, pursuit of the increase in sensitivity results in the degradation of line edge roughness and development defect property in addition to the decrease in resolution and the degradation of pattern profile. As a result, a problem of severe yield reduction of devices occurs. Therefore, it has been strongly desired to provide a resist composition satisfying these properties at the same time. The term "line edge roughness" as used herein means a phenomenon wherein an edge between a line pattern of resist and a surface of substrate irregularly fluctuates in the direction vertical to the line due to the characteristics of resist, and the edge looks uneven when the pattern is observed from just above. Since the unevenness is transferred to the substrate in an etching step using the resist as a mask, the unevenness causes deterioration in electric properties thereby resulting in the yield reduction. A trade off relation between high sensitivity and high resolution, good resist pattern profile, good line edge roughness and good development defect property exists in the resist composition for an electron beam, and it is a very important subject to be solved that these characteristics are satisfied at the same time.

As a resist suitable for the electron beam or X ray lithography process, a chemical amplification resist mainly utilizing an acid catalyst reaction has been used in view of high sensitivity. In case of a negative resist, a chemical amplification composition containing an alkali-soluble resin, a crosslinking agent, an acid generator and other additives as main components is effectively employed.

With respect to improvement in characteristics of the chemical amplification negative resist, various investigations attending to the alkali-soluble resin have been made. For instance, the use of a resin containing a p-hydroxystyrene unit and having a narrow dispersity is described in Japanese Patent 2962145. The use of polyvinyl phenol having a low molecular weight and a narrow dispersity and a mixture thereof is described in JP-A-7-120924 (the term "JP-A" as used herein means an "unexamined published Japanese patent application"). The use of a copolymer of hydroxystyrene wherein the hydroxy groups are partially esterified is described in JP-A-9-43837. The use of a mixture of a copolymer having a low molecular weight and containing a hydroxystyrene unit and a homopolymer of hydroxystyrene is described in JP-A-10-186661. The use of a copolymer of hydroxystyrene wherein the hydroxy groups are partially etherified is described in JP-A-2000-162773. The use of a polymer containing a hydroxystyrene unit having the hydroxy group in the 3-position is described in European Patent 1117002A1.

However, any of these alkali-soluble resins hitherto known cannot fulfill requirements for high sensitivity, high resolution, good resist pattern profile, good line edge roughness and good development defect property at the same time in the ultra fine pattern region.

SUMMARY OF THE INVENTION

Therefore, an object of the present invention is to solve the problems of performance-improving techniques in the ultra fine process of semiconductor devices.

Another object of the present invention is to provide a negative resist composition which fulfills requirements for high sensitivity, high resolution, good resist pattern profile, good line edge roughness and good development defect property at the same time in fine process of semiconductor devices using particularly, an electron beam or an X ray.

Other objects of the present invention will become apparent from the following description.

As a result of the intensive investigations, it has been found that the above-described objects can be accomplished by a chemical amplification negative resist composition comprising two kinds of alkali-soluble resins having specific structures, a crosslinking agent, an acid generator and a nitrogen-containing basic compound.

Specifically, the present invention includes the following negative resist compositions:

(1) A negative resist composition comprising (A-1) an alkali-soluble resin containing a repeating unit represented by formula (1) shown below, (A-2) an alkali-soluble resin containing a repeating unit represented by formula (2) shown below, (B) a crosslinking agent crosslinking with the alkali-soluble resin (A-1) or (A-2) by the action of an acid, (C) a compound that generates an acid upon irradiation of an actinic ray or radiation, and (D) a nitrogen-containing basic compound.

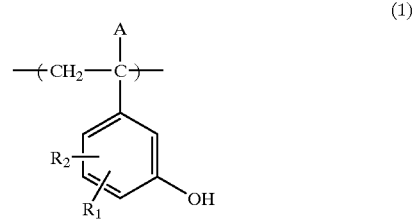

(1)

In formula (1), A represents a hydrogen atom, an alkyl group, a halogen atom or a cyano group; and $R_1$ and $R_2$ each independently represent a hydrogen atom, a halogen atom, a hydroxy group, an alkyl group, an alkenyl group, a cycloalkyl group, an aryl group, an aralkyl group, an alkoxy group, an alkylcarbonyloxy group or an alkylsulfonyloxy group, or $R_1$ and $R_2$ may be combined with each other to form a ring.

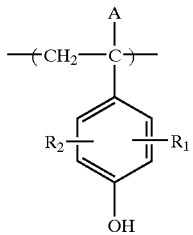

(2)

In formula (2), A, $R_1$ and $R_2$ have the same meanings as A, $R_1$ and $R_2$ defined in formula (1) respectively, provided that the alkali-soluble resin (A-2) has the structure different from that of the alkali-soluble resin (A-1).

(2) The negative resist composition as described in item (1) above, wherein the alkali-soluble resin (A-1) contains a repeating unit represented by formula (1) and at least one repeating unit selected from repeating units represented by formulae (3), (4) and (5) shown below and/or the alkali-soluble resin (A-2) contains a repeating unit represented by formula (2) and at least one repeating unit selected from repeating units represented by formulae (3), (4) and (5) shown below.

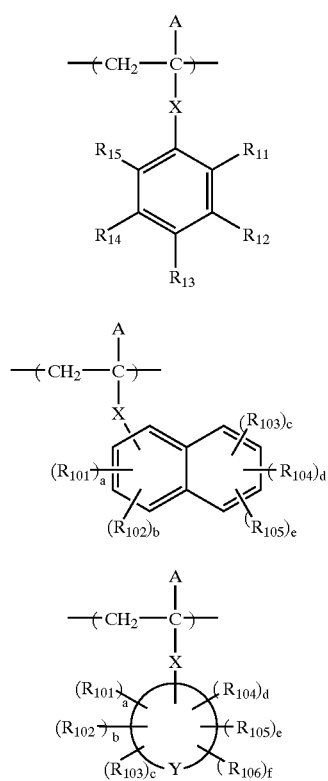

(3)

(4)

(5)

In the above formulae,

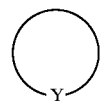

represents a ring structure selected from the following structures:

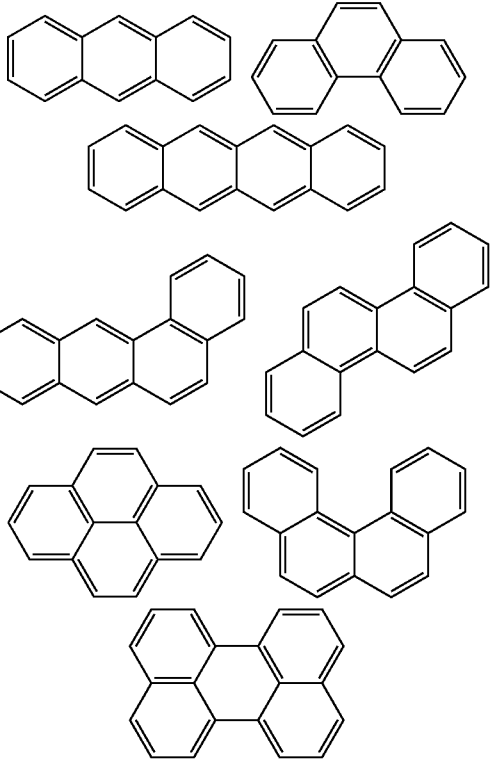

A has the same meaning as A defined in formula (1); X represents a single bond, —COO—, —O— or —CON($R_{16}$)—; $R_{16}$ represents a hydrogen atom or an alkyl group; $R_{11}$ to $R_{15}$ each independently have the same meanings as $R_1$ defined in formula (1); $R_{101}$ to $R_{106}$ each independently represent a hydrogen atom, a hydroxy group, a halogen atom, an alkyl group, an alkoxy group, an alkylcarbonyloxy group, an alkylsulfonyloxy group, an alkenyl group, an aryl group, an aralkyl group or a carboxy group; and a to f each independently represent an integer of from 0 to 3.

(3) The negative resist composition as described in item (1) or (2) above, wherein the crosslinking agent (B) is a phenol compound that has at least two benzene rings and does not contain a nitrogen atom.

(4) The negative resist composition as described in any one of items (1) to (3) above, which further comprises a surface active agent.

DETAILED DESCRIPTION OF THE INVENTION

The compounds for use in the negative resist composition of the present invention will be described in detail below.
(1) Alkali-Soluble Resins [Components (A-1) and (A-2)] for Use in the Present Invention The negative resist composition of the present invention contains at least two kinds of alkali-soluble resins, specifically, an alkali-soluble resin (A-1) containing a repeating unit represented by formula (1) and an alkali-soluble resin (A-2) containing a repeating unit represented by formula (2), which is different from the repeating unit represented by formula (1) in the alkali-soluble resin (A-1).

In formula (1), the alkyl group represented by A is preferably an alkyl group having from 1 to 3 carbon atoms. The halogen atom represented by A includes, for example, chlorine, bromine and fluorine atoms.

A represents preferably a hydrogen atom or an alkyl group having from 1 to 3 carbon atoms (e.g., methyl or ethyl), and particularly preferably a hydrogen atom or a methyl group.

The halogen atom represented by $R_1$ or $R_2$ includes, for example, chlorine, bromine, fluorine and iodine atoms.

The alkyl group, alkenyl group, cycloalkyl group, aryl group, aralkyl group, alkoxy group, alkylcarbonyloxy group or alkylsulfonyloxy group represented by $R_1$ or $R_2$ may have a substituent.

Preferably, $R_1$ and $R_2$ each independently represent a hydrogen atom, a halogen atom, a straight chain or branched alkyl group having from 1 to 8 carbon atoms which may have a substituent, an alkenyl group having from 2 to 8 carbon atoms which may have a substituent, a cycloalkyl group having from 5 to 10 carbon atoms which may have a substituent, an aryl group having from 6 to 15 carbon atoms which may have a substituent, an aralkyl group having from 7 to 16 carbon atoms which may have a substituent, an alkoxy group having from 1 to 8 carbon atoms which may have a substituent or an alkylcarbonyloxy group having from 2 to 8 carbon atoms which may have a substituent.

The substituents for the above groups include, for example, an alkyl group (e.g., methyl, ethyl, propyl, isopropyl, butyl, tert-butyl or hexyl group), an aryl group (e.g., phenyl or naphthyl group), an aralkyl group, a hydroxy group, an alkoxy group (e.g., methoxy, ethoxy, butoxy, octyloxy or dodecyloxy group), an acyl group (e.g., acetyl, propanoyl or benzoyl group) and an oxo group.

$R_1$ and $R_2$ may be combined with each other to form a ring.

More preferably, $R_1$ and $R_2$ each independently represent a hydrogen atom, a halogen atom, an alkyl group having from 1 to 4 carbon atoms which may have a substituent, an alkoxy group having from 1 to 4 carbon atoms which may have a substituent or an alkylcarbonyloxy group having from 2 to 4 carbon atoms which may have a substituent, and particularly preferably a hydrogen atom, a chlorine atom, a bromine atom, an iodine atom, an alkyl group having from 1 to 3 carbon atoms (e.g., methyl, ethyl, propyl or isopropyl group) or an alkoxy group having from 1 to 3 carbon atoms (e.g., methoxy, ethoxy, propyloxy or isopropyloxy group).

In formula (2), A, $R_1$ and $R_2$ have the same meanings as A, $R_1$ and $R_2$ defined in formula (1), respectively.

The alkali-soluble resin of Component (A-1) and alkali-soluble resin of Component (A-2) for use in the negative resist composition of the present invention may be a homopolymer containing only a repeating unit represented by formula (1) and a homopolymer containing only a repeating unit represented by formula (2) or a copolymer containing a repeating unit represented by formula (1) and at least one repeating unit represented by any one of formulae (3) to (5) and a copolymer containing a repeating unit represented by formula (2) and at least one repeating unit represented by any one of formulae (3) to (5), respectively. The copolymers are preferable, for example, in view of alkali dissolution speed of resist film and improvement in film property.

In formula (3), A has the same meaning as A defined in formula (1). X represents a single bond, —COO—, —O— or —CON($R_{16}$)—, and $R_{16}$ represents a hydrogen atom or an alkyl group, preferably an alkyl group having from 1 to 3 carbon atoms (e.g., methyl, ethyl or propyl group). X represents preferably a single bond, —COO— or —CON($R_{16}$)—, and particularly preferably a single bond or —COO—.

$R_{11}$ to $R_{15}$ each independently have the same meanings as $R_1$ defined in formula (1).

$R_{101}$ to $R_{106}$ each independently represent a hydrogen atom, a hydroxy group, a halogen atom (e.g., chlorine, bromine, fluorine or iodine), an alkyl group, preferably a straight chain or branched alkyl group having from 1 to 8 carbon atoms which may have a substituent, an alkoxy group, preferably a straight chain or branched alkoxy group having from 1 to 8 carbon atoms which may have a substituent, an alkylcarbonyloxy group, preferably a straight chain or branched alkylcarbonyloxy group having from 2 to 8 carbon atoms which may have a substituent, an alkylsulfonyloxy group, preferably a straight chain or branched alkylsulfonyloxy group having from 1 to 8 carbon atoms which may have a substituent, an alkenyl group, preferably an alkenyl group having from 2 to 8 carbon atoms which may have a substituent, an aryl group, preferably an aryl group having from 6 to 15 carbon atoms which may have a substituent, an aralkyl group, preferably an aralkyl group having from 7 to 16 carbon atoms which may have a substituent or a carboxy group.

The substituents for the above groups include the substituents described for the groups represented by $R_1$ in formula (1).

Preferably, $R_{101}$ to $R_{106}$ each independently represent a hydroxy group, a halogen atom, an alkyl group having from 1 to 4 carbon atoms which may have a substituent, an alkoxy group having from 1 to 4 carbon atoms which may have a substituent or an alkylcarbonyloxy group having from 2 to 4 carbon atoms which may have a substituent, and particularly preferably a hydrogen atom, a chlorine atom, a bromine atom, an iodine atom, an alkyl group having from 1 to 3 carbon atoms (e.g., methyl, ethyl, propyl or isopropyl group), an alkoxy group having from 1 to 3 carbon atoms (e.g., methoxy, ethoxy, propyloxy or isopropyloxy group) or an alkylcarbonyloxy group having from 2 to 3 carbon atoms (e.g., acetyloxy or propionyloxy group).

a to f each independently represent an integer of from 0 to 3.

The resin of Component (A-1) for use in the negative resist composition of the present invention may be any of a resin containing only one repeating unit represented by formula (1), a resin containing two or more repeating units each represented by formula (1), and a resin containing a repeating unit represented by formula (1) and at least one repeating unit selected from repeating units represented by formulae (3) to (5). The resins may further contain a repeating unit corresponding to other polymerizable monomer, which control film forming property or alkali solubility. These are also applied to the resin of Component (A-2) for use in the negative resist composition of the present invention. Examples of such a polymerizable monomer include styrene, an alkyl-substituted styrene, an alkoxy-substituted styrene, an O-alkylated styrene, an O-acylated styrene, a hydrogenated hydroxystyrene, maleic anhydride, an acrylic acid derivative (e.g., acrylic acid or an acrylate), a methacrylic acid derivative (e.g., methacrylic acid or a methacrylate), an N-substituted maleimide, acrylonitrile and methacrylonitrile, but the present invention should not be construed as being limited thereto.

In the resin of Component (A-1) for use in the negative resist composition of the present invention, the content of the repeating unit represented by formula (1) is ordinarily from 50 to 100% by mole, and preferably from 70 to 100% by mole.

In the resin of Component (A-2) for use in the negative resist composition of the present invention, the content of the repeating unit represented by formula (2) is ordinarily from 50 to 100% by mole, and preferably from 70 to 100% by mole.

In the resin of Component (A-1), a ratio of content of the repeating unit represented by formula (1) to the total content of repeating units represented by formulae (3) to (5) is preferably from 100/0 to 50/50, more preferably from 100/0 to 60/40, and particularly preferably from 100/0 to 70/30 in terms of a molar ratio. A ratio of content of the repeating unit represented by formula (2) to the total content of repeating units represented by formulae (3) to (5) in the resin of Component (A-2) is also the same as above.

A molecular weight of the resin of Component (A-1) or the resin of Component (A-2) is preferably from 1,000 to 10,000, more preferably from 1,500 to 9,000, and particularly preferably from 2,000 to 8,500 in terms of a weight average molecular weight. When the weight average molecular weight is less than 1,000, large decrease in sensitivity may arise in some cases. On the other hand, when the weight average molecular weight exceeds 10,000, degradation of pattern profile and decrease in resolution may happen in some cases.

The molecular weight distribution of the resin of Component (A-1) or the resin of Component (A-2) is preferably from 1.0 to 2.5, and more preferably from 1.0 to 2.0.

The amount of each of the resin of Component (A-1) and the resin of Component (A-2) is ordinarily from 30 to 95% by weight, preferably from 40 to 90% by weight, and particularly preferably from 50 to 80% by weight, based on the total solid content of the negative resist composition.

A ratio of the resin of Component (A-1) to the resin of Component (A-2) is 95/5 to 5/95, and preferably from 90/10 to 10/90 in terms of a weight ratio of Component (A-1)/Component (A-2).

The resin of Component (A-1) and the resin of Component (A-2) can be synthesized by a known radical polymerization method or anion polymerization method. For instance, according to the radical polymerization method, a vinyl monomer is dissolved in an appropriate organic solvent and subjected to react at room temperature or under a heated condition using as an initiator, a peroxide (e.g., benzoyl peroxide), a nitrile compound (e.g., azobisisobutyronitrile) or a redox compound (e.g., cumene hydroperoxide/ferric salt) to obtain a polymer. According to the anion polymerization method, a vinyl monomer is dissolved in an appropriate organic solvent and subjected to react ordinarily under a cooled condition using as an initiator, a metal compound (e.g., butyl lithium) to obtain a polymer.

Specific examples of the alkali-soluble resin of Component (A-1) for use in the negative resist composition of the present invention are set forth below, but the present invention should not be construed as being limited thereto.

A1-1
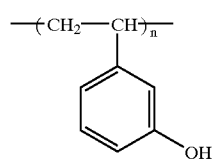

A1-2
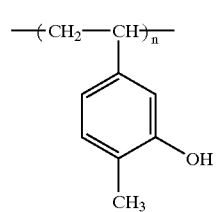

A1-3
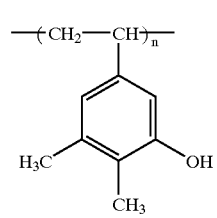

A1-4
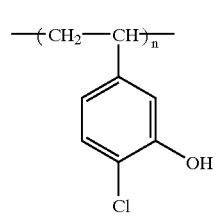

A1-5
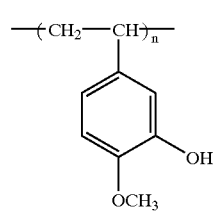

A1-6
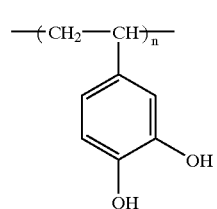

A1-7
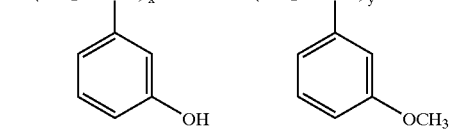

A1-8
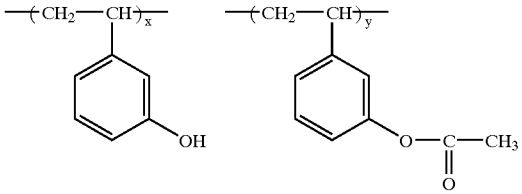

A1-9
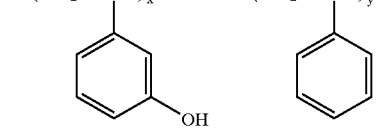

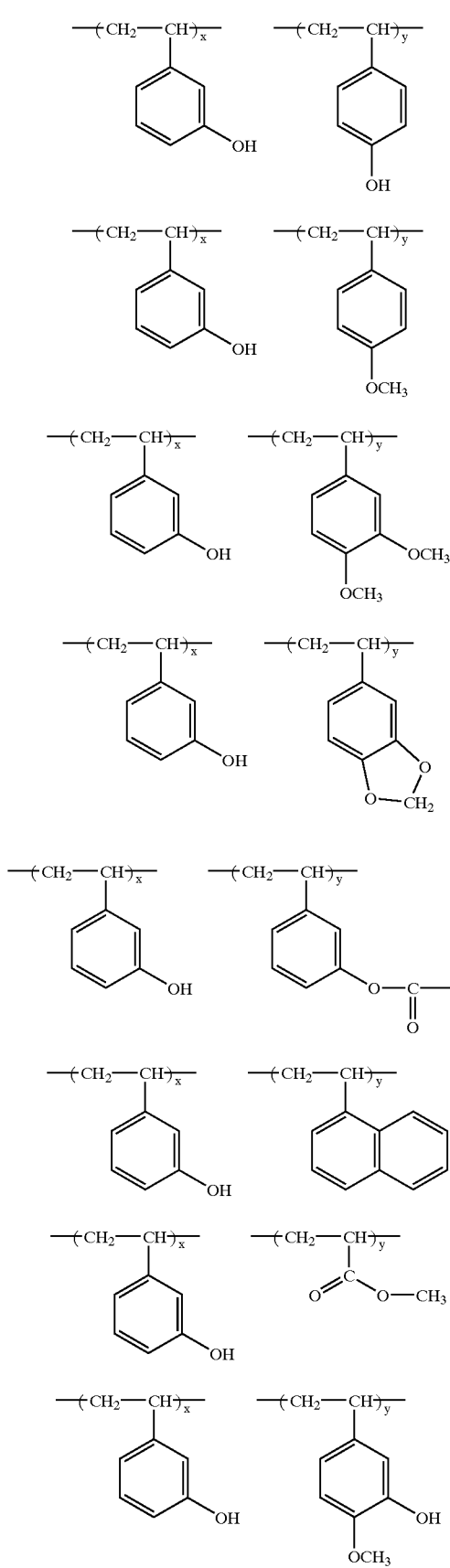
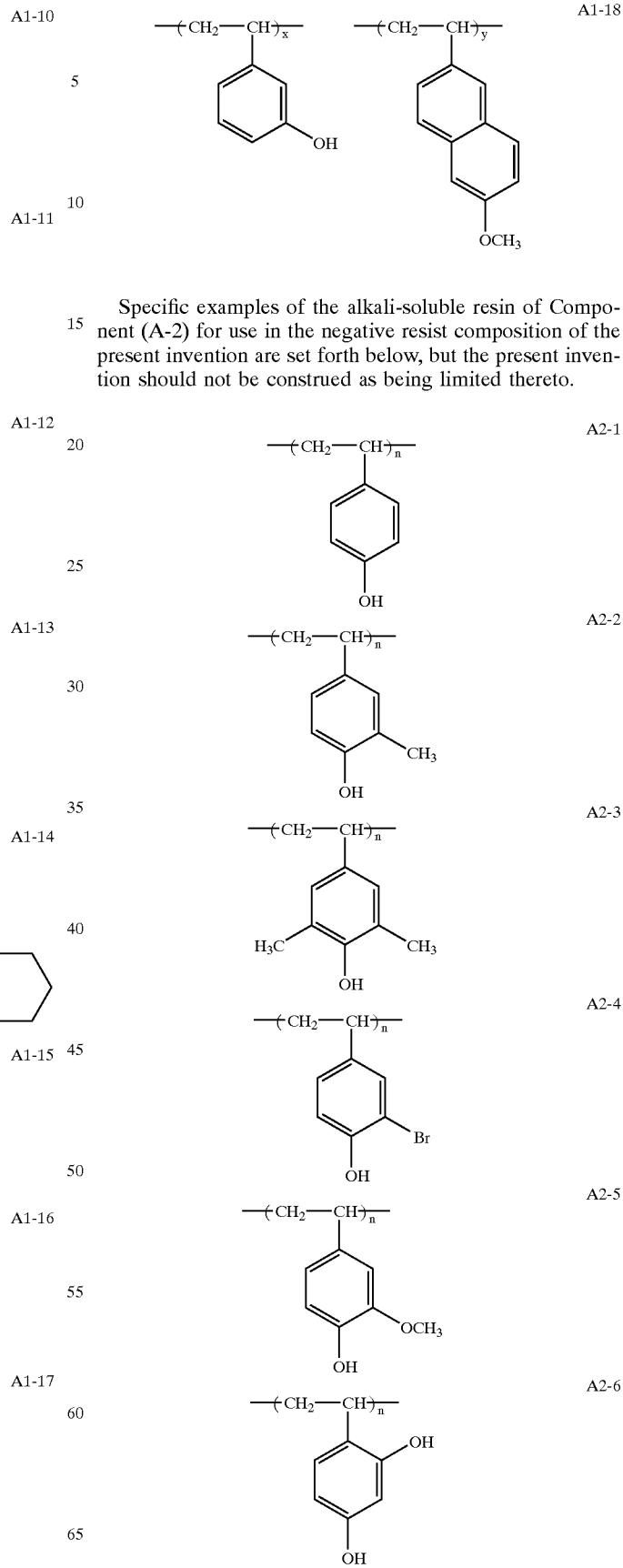
Specific examples of the alkali-soluble resin of Component (A-2) for use in the negative resist composition of the present invention are set forth below, but the present invention should not be construed as being limited thereto.

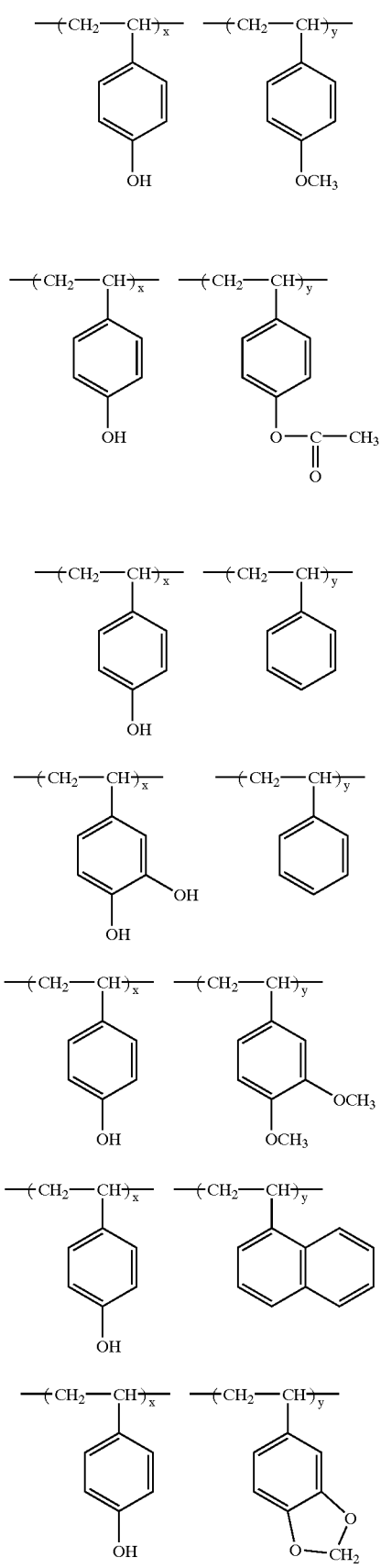
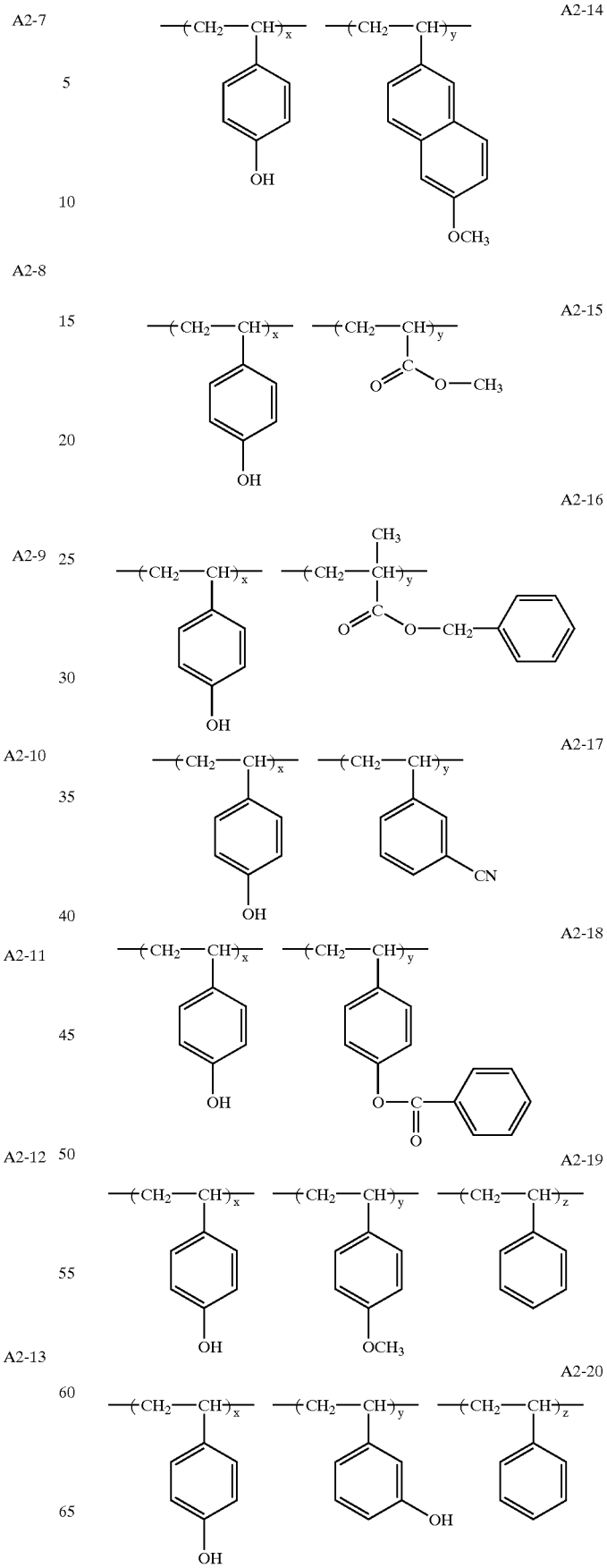

(2) Acid Crosslinking Agent [Component (B)] for Use in the Present Invention

In the negative resist composition of the present invention, a compound crosslinkable by the action of an acid (hereinafter also referred to as an "acid crosslinking agent" or simply a "crosslinking agent" sometimes) is used together with the alkali-soluble resins. Known acid crosslinking agents can be effectively employed in the negative resist composition of the present invention.

Preferred examples of the acid crosslinking agent for use in the present invention include compounds or resins having at least two groups selected from a hydroxymethyl group, an alkoxymethyl group, an acyloxymethyl group and an alkoxymethyl ether group, and epoxy compounds.

More preferred examples thereof include alkoxymethylated or acyloxymethylated melamine compounds or resins, alkoxymethylated or acyloxymethylated urea compounds or resins, hydroxymethylated or alkoxymethylated phenol compounds or resins, and alkoxymethyl-etherified phenol compounds or resins.

Phenol compounds which contain at least two benzene rings in their molecules and do not include a nitrogen atom are also preferably used.

Particularly preferred examples of Component (B) include phenol derivatives having a molecular weight of not more than 1,200, containing from 3 to 5 benzene rings in the molecule thereof, and having at least two groups selected from a hydroxymethyl group and an alkoxymethyl group, wherein the hydroxymethyl group and alkoxymethyl group are concentrically connected to one of the benzene rings or dispersedly connected to two or more of the benzene rings. By using such a phenol derivative, the effects of the present invention can be more remarkably achieved.

The alkoxymethyl group connected to the benzene ring preferably includes an alkoxymethyl group having not more than 6 carbon atoms. Specific examples of the alkoxymethyl group include methoxymethyl, ethoxymethyl, n-propoxymethyl, isopropoxymethyl, n-butoxymethyl, isobutoxymethyl, sec-butoxymethyl and tert-butoxymethyl groups.

Of the phenol derivatives, those particularly preferred are set forth below.

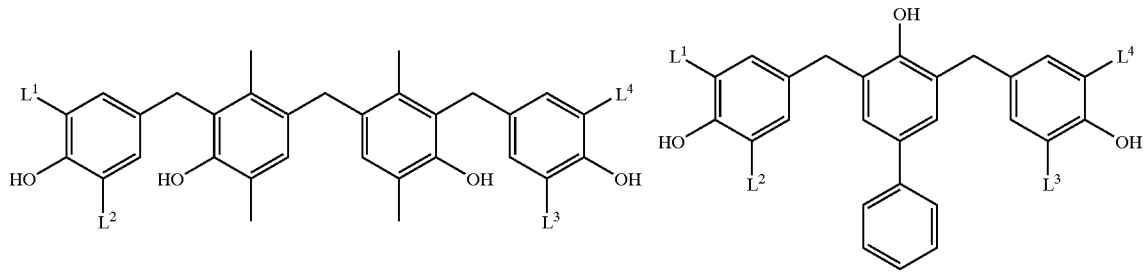

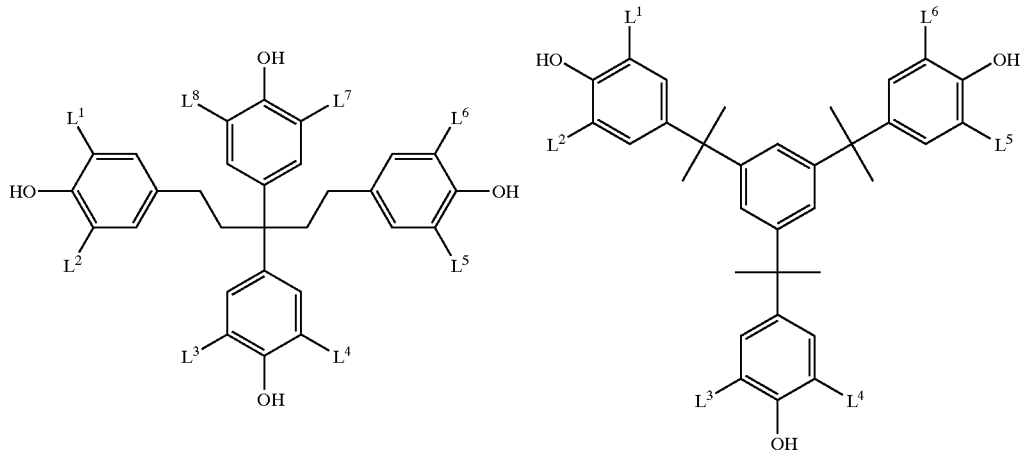

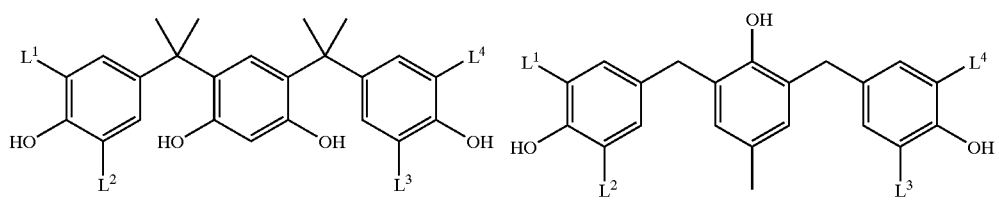

-continued
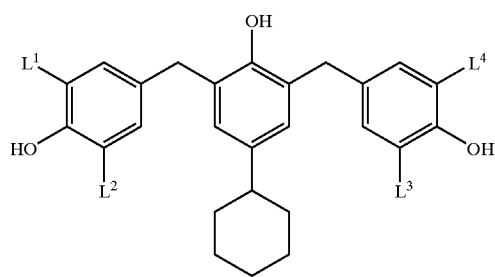
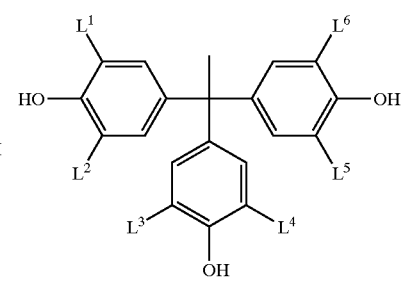
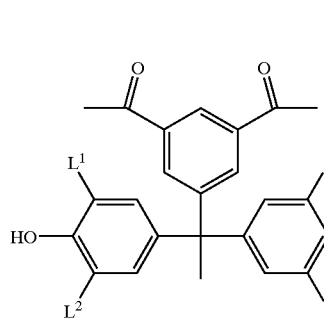
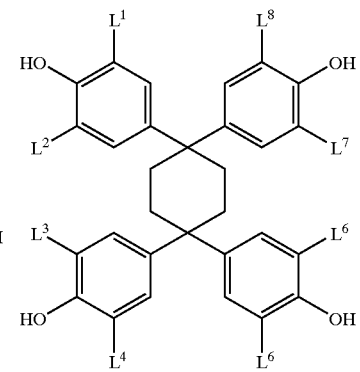
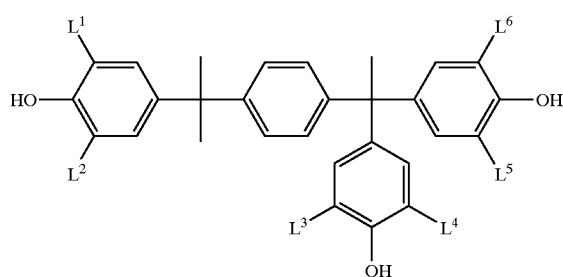
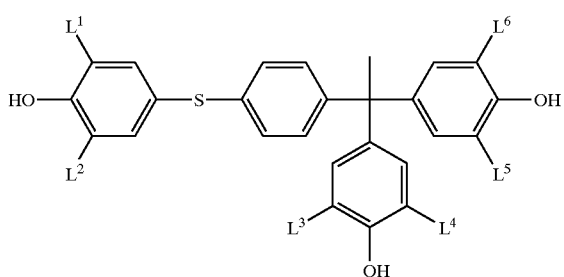
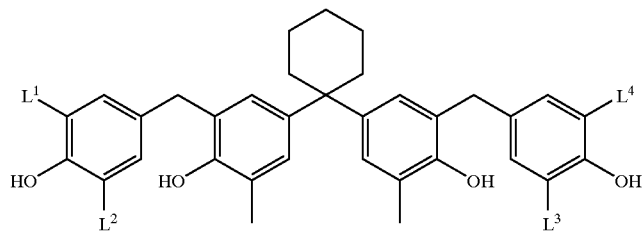
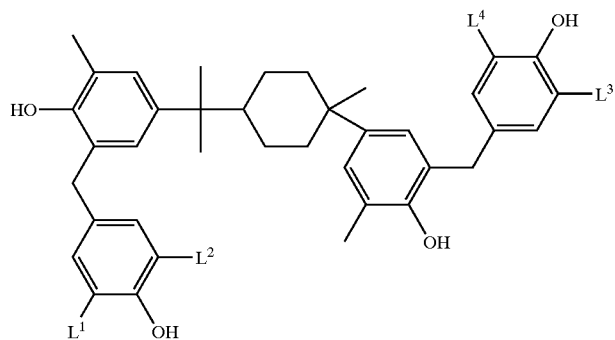
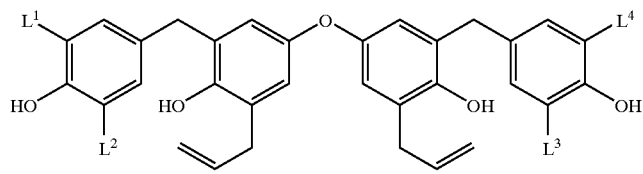

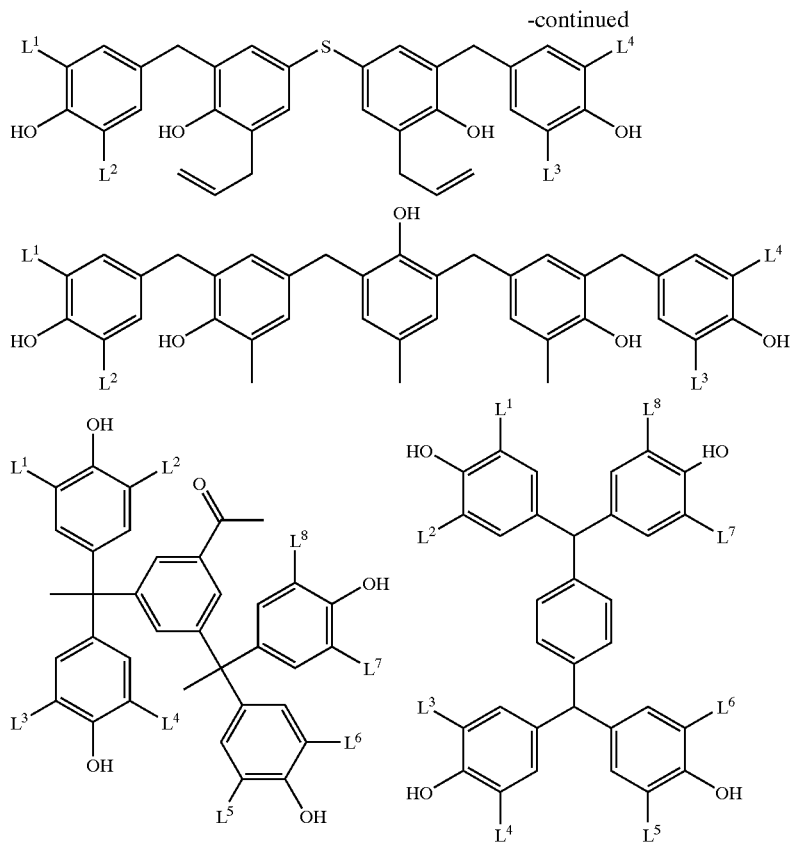

wherein, $L^1$ to $L^8$, which may be the same or different, each represent a hydroxymethyl group, a methoxymethyl group or an ethoxymethyl group.

The phenol derivative having a hydroxymethyl group can be obtained by reacting a corresponding phenol compound having no hydroxymethyl group (the compound represented by any one of the above-described formulae wherein all of $L^1$ to $L^8$ represent hydrogen atoms) with formaldehyde in the presence of a base catalyst. At that time, it is preferred to carry out the reaction at a temperature of not higher than 60° C. in order to prevent the occurrence of resinification or gelation. Specifically, the phenol derivative can be synthesized according to methods described, e.g., in JP-A-6-282067 and JP-A-7-64285.

The phenol derivative having an alkoxymethyl group can be obtained by reacting a corresponding phenol derivative having a hydroxymethyl group with an alcohol in the presence of an acid catalyst. At that time, it is preferred to carry out the reaction at a temperature of not higher than 100° C. in order to prevent the occurrence of resinification or gelation. Specifically, the phenol derivative can be synthesized according to methods described, e.g., in EP-A-632,003.

The phenol derivative having a hydroxymethyl group or an alkoxymethyl group synthesized as described above is preferable in view of the stability during storage, and the phenol derivative having an alkoxymethyl group is particularly preferable from the standpoint of the stability during storage.

The phenol derivatives having at least two groups selected from a hydroxymethyl group and an alkoxymethyl group in total, wherein these groups are concentrically connected to one of the benzene rings or dispersedly connected to two or more of the benzene rings, may be used individually or in combination of two or more thereof.

Preferred examples of the crosslinking agent further include (i) compounds having an N-hydroxymethyl group, an N-alkoxymethyl group or an N-acyloxymethyl group, and (ii) epoxy compounds, as described below.

(i) Examples of the compound having an N-hydroxymethyl group, an N-alkoxymethyl group or an N-acyloxymethyl group include alkylated hexamethoxymelamine compounds as described in EP-A-133,216, oligomer-hexamethoxymelamine-formaldehyde condensates as described in West German Patent 3,634,371, urea crosslinking agents having a melamine skeleton as described in West German Patent 3,711,264, and alkoxy-substituted benzoguanamine-formaldehyde condensates as described in EP-A-212,482.

More referred examples thereof include a melamine-formaldehyde derivative having at least two groups selected from an N-hydroxymethyl group, an N-alkoxymethyl group and an N-acyloxymethyl group. Among them, the melamine-formaldehyde derivative having N-alkoxymethyl groups is particularly preferred.

(ii) Examples of the epoxy compound include epoxy compounds containing at least one epoxy group including monomers, dimers, oligomers and polymers. Specific examples of the epoxy compound include a reaction product of bisphenol A with epichlorohydrin and a reaction product of a low molecular weight phenol-formaldehyde resin with epichlorohydrin. Epoxy resins as described in U.S. Pat. No. 4,026,705 and British Patent 1,539,192 may also be used.

The crosslinking agent is used in an amount of from 3 to 65% by weight, and preferably from 5 to 50% by weight, base on the total solid content of the negative resist composition. When the amount of the crosslinking agent added is less than 3% by weight, film thickness loss occurs, and on the other hand, when the amount exceeds 65% by weight, the resolution may decrease and further a disadvantage in stability of the resist solution during storage may occur.

In the negative resist composition of the present invention, the crosslinking agents may be used individually or in combination of two or more thereof.

For instance, in the case where in addition to the phenol derivative, other crosslinking agent, for example, the crosslinking agent (i) or (ii) described above is used together, a ratio of the phenol derivative to other crosslinking agent is ordinarily from 100/0 to 20/80, preferably from 90/10 to 40/60, and more preferably from 80/20 to 50/50, in terms of a molar ratio.

(3) Compound that Generates an Acid Upon Irradiation of an Actinic Ray or Radiation (Acid Generator) [Component (C)] for Use in the Present Invention The acid generator of component (C) for use in the negative resist composition of the present invention can be widely selected from known acid generators. Examples of the acid generator include compounds described in JP-A-2002-6500, JP-A-2002-14470, EP-A-1117004 and EP-A-1109066.

Preferred acid generator includes onium salts, for example, diazonium salts, ammonium salts, phosphonium salts, iodonium salts, sulfonium salts, selenonium salts or arsonium salts, organic halogen compounds, organic metals/ organic halogen compounds, photo-acid generators having an o-nitrobenzyl type protective group, compounds generating a sulfonic acid upon photolysis, as typified by iminosulfonates, disulfone compounds, diazoketosulfone compounds and diazodisulfone compounds.

The content of acid generator of component (C) for use in the negative resist composition of the present invention is preferably from 1 to 30% by weight, more preferably from 2 to 20% by weight, and particularly preferably from 3 to 18% by weight, based on the solid content of the negative resist composition.

In the negative resist composition of the present invention, the acid generators of Component (C) may be used individually or as a mixture of two or more thereof.

(4) Nitrogen-Containing Basic Compound [Component (D)] for Use in the Present Invention The negative resist composition of the present invention contains a nitrogen-containing organic basic compound as the indispensable component. The nitrogen-containing organic basic compound used includes known compounds, for example, nitrogen-containing organic basic compounds described in JP-A-2002-6500, EP-A-1117004 and EP-A-1109066.

Preferred examples of the nitrogen-containing organic basic compound include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl) piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2, 4-diaminopyrimidine, 4,6-dihydroxypyrimidine, 2-pyrazoline, 3-pyrazoline, N-aminomorpholine, N-(2-aminoethyl)morpholine, trimethylimidazole, triphenylimidazole, methyldiphenylimidazole and 1,5-diazabicyclo[4.3.0]non-5-ene. However, the present invention should not be construed as being limited to these compounds.

In the negative resist composition of the present invention, the nitrogen-containing basic compounds may be used individually or in combination of two or more thereof. The amount of the nitrogen-containing basic compound used is ordinarily from 0.001 to 10% by weight, and preferably from 0.01 to 5% by weight, based on the total solid content of the negative resist composition.

The negative resist composition of the present invention may contain a surface active agent. Specifically, the surface active agent used includes nonionic surface active agents, for example, polyoxyethylene alkyl ethers, e.g., polyoxyethylene lauryl ether, polyoxyethylene stearyl ether, polyoxyethylene cetyl ether or polyoxyethylene oleyl ether, polyoxyethylene alkylaryl ethers, e.g., polyoxyethylene octylphenol ether or polyoxyethylene nonylphenol ether, polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate or sorbitan tristearate, polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate; fluorine-base or silicone-base surface active agents, e.g., Eftop EF 301, EF 303 and EF 352 (manufactured by Shin-Akita Kasei Co., Ltd.), Megafac F171 and F173 (manufactured by Dainippon Ink and Chemicals, Inc.), Florad FC430 and FC431 (manufactured by Sumitomo 3M Ltd.), Asahiguard AG710, Surflon S-382, SC101, SC102, SC103, SC104, SC105 and SC106 (manufactured by Asahi Glass Co., Ltd.), Troysol S-366 (manufactured by Troy Chemical Corp.); organosiloxane polymer (KP341, manufactured by Shin-Etsu Chemical Co., Ltd.) and acrylic acid or methacrylic acid (co)polymer (Polyflow No. 75 and No. 95, manufactured by Kyoeisha Yushi Kagaku Kogyo K.K.). The amount of surface active agent used is usually not more than 2 parts by weight, and preferably not more than 1 part by weight per 100 parts by weight of the solid content of the resist composition of the invention.

The surface active agents may be used individually or as a combination of two or more thereof.

The negative resist composition of the present invention preferably contains one or more fluorine-based and/or silicon-based surface active agents (including a fluorine atom-containing surface active agent, a silicon atom-containing surface active agent and a surface active agent containing both a fluorine atom and a silicon atom).

Examples of such a surface active agent include those described in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862 and U.S. Pat. Nos. 5,405,720, 5,360,692, 5,529,881, 5,296,330, 5,436,098, 5,576,143, 5,294,511 and 5,824,451. Commercially available surface active agents described below may also be used as they are.

Examples of the commercially available surface active agent, which can be used, include fluorine-based or silicon-based surface active agents, e.g., Eftop EF301, EF303 and EF352 (manufactured by Shin-Akita Kasei Co., Ltd.), Florad FC430 and FC431 (manufactured by Sumitomo 3M Ltd.), Megafac F171, F173, F176, F189 and R08

(manufactured by Dainippon Ink and Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as the silicon-based surface active agent.

In addition to the surface active agents described above, a surface active agent of polymer containing a fluoro-aliphatic group derived from a fluoro-aliphatic compound produced by a telomerization method (also referred to as a telomer method) or an origomerization method (also referred to as an origomer method). The fluoro-aliphatic compound can be synthesized according to the method described in JP-A-2002-90991.

Of the polymers containing fluoro-aliphatic group, a copolymer of a monomer having a fluoro-aliphatic group and a polyoxyalkylene acrylate and/or polyoxyalkylene methacrylate, which may be a random copolymer or a block copolymer, is preferred. Examples of the polyoxyalkylene group include a polyoxyethylene group, a polyoxypropylene group and a polyoxybutylene group. A unit containing alkylene groups having chain lengths different from each other, for example, an oxyethylene-oxypropylene-oxyethylene block linkage or an oxyethylene-oxypropylene block linkage is also used. The copolymer of a monomer having a fluoro-aliphatic group and a polyoxyalkylene acrylate and/or polyoxyalkylene methacrylate includes not only a two-component copolymer but also a three-component or more copolymer obtained by copolymerization using two or more different monomers having fluoro-aliphatic groups or two or more different polyoxyalkylene acrylates and/or polyoxyalkylene methacrylates.

Examples of such surface active agent include commercially available surface active agents, for example, Megafac F178, F-470, F-473, F-475, F-476 and F-472 (manufactured by Dainippon Ink and Chemicals, Inc.). Further, a copolymer of an acrylate or methacrylate having a $C_6F_{13}$ group, a polyoxyethylene acrylate or methacrylate and a polyoxypropylene acrylate or methacrylate, a copolymer of an acrylate or methacrylate having a $C_8F_{17}$ group and a polyoxyalkylene acrylate or methacrylate, and a copolymer of an acrylate or methacrylate having a $C_8F_{17}$ group, a polyoxyethylene acrylate or methacrylate and a polyoxypropylene acrylate or methacrylate are exemplified.

The amount of fluorine-based and/or silicon-based surface active agent used is preferably from 0.0001 to 2% by weight, and more preferably from 0.001 to 1% by weight, based on the total negative resist composition (excluding a solvent) of the present invention.

The negative resist composition of the present invention may include other components, for example, a dye, a plasticizer, a photo-decomposable base compound or a photo-base generator. Examples of these compounds include respective compounds described in JP-A-2002-6500.

Also, a solvent for use in the negative resist composition of the present invention includes solvents described in JP-A-2002-6500.

Preferred examples of the solvent used include ethylene glycol monoethyl ether acetate, cyclohexanone, 2-heptanone, propylene glycol monomethyl ether, propylene glycol monomethyl ether acetate, propylene glycol monomethyl ether propionate, propylene glycol monoethyl ether acetate, methyl 3-methoxypropionate, ethyl 3-ethoxypropionate, methyl β-methoxyisobutyrate, ethyl butyrate, propyl butyrate, methyl isobutyl ketone, ethyl acetate, isoamyl acetate, ethyl lactate, toluene, xylene, cyclohexyl acetate, diacetone alcohol, N-methylpyrrolidone, N,N-dimethylformamide, γ-butyrolactone, N,N-dimethylacetamide, propylene carbonate and ethylene carbonate. The solvents may be used individually or in combination of two or more thereof.

The solid content of the negative resist composition is dissolved in the solvent as described above. The solid content concentration in the solution is preferably from 3 to 40% by weight, more preferably from 5 to 30% by weight, and still more preferably from 7 to 20% by weight.

The negative resist composition of the present invention is coated on a substrate to form a thin film. A thickness of the film coated is preferably from 0.05 to 4.0 μm.

In the present invention, a known inorganic or organic anti-reflective coating may be used, if desired. Further, the anti-reflective coating may be coated on the resist layer. Examples of the anti-reflective coating used include anti-reflective coatings described in JP-A-2002-6500.

The use of the negative resist composition of the present invention is described below.

The pattern formation process on a resist film, for example, in the production of precision integrated circuit device comprises applying the negative resist composition of the present invention to a substrate (for example, a silicon/silicon dioxide film, a glass substrate, a metal substrate, a silicon nitride substrate, a titanium nitride substrate or a chromium oxide substrate) directly or through the anti-reflective coating as described above previously provided on the substrate, irradiating the coated film directly or through a mask using radiation or an actinic ray as a light source, heating, developing, rinsing and drying the coated film to form a good resist pattern. The exposure source used includes preferably light having a wavelength of from 150 to 250 nm (e.g., KrF excimer laser (248 nm), ArF excimer laser (193 nm) or F2 excimer laser (157 nm)), an electron beam and an X ray. Particularly, a device utilizing an electron beam or an X ray as the exposure light source is preferably used.

As a developing solution for the negative resist composition of the present invention, known developing solutions can be used. Examples of the developing solution used include developing solutions described in JP-A-2002-6500.

The present invention will be described in greater detail with reference to the following examples, but the present invention should not be construed as being limited thereto.

Synthesis Examples of Constituent Materials
(1) Synthesis of Alkali-Soluble Resin of Component (A2)

Synthesis Example 1

Synthesis of Resin (A2-7)

In 30 ml of 1-methoxy-2-propanol were dissolved 3.9 g (0.024 mol) of 4-acetoxystyrene and 0.8 g (0.006 mol) of 4-methoxystyrene, and while stirring the solution under a nitrogen gas stream, 70 ml of a 1-methoxy-2-propanol solution containing 50 mg of a polymerization initiator, i.e., 2,2'-azobis(2,4-dimethylvaleronitrile) (V-65 manufactured by Wako Pure Chemical Industries, Ltd.), 9.1 g (0.056 mol) of 4-acetoxystyrene and 1.9 g (0.014 mol) of 4-methoxystyrene was added dropwise thereto at 70° C. over a period of 2 hours. After 2 hours, 50 mg of the polymerization initiator was additionally added thereto and the reaction was further continued for 2 hours. Thereafter, the temperature was raised to 90° C. and the reaction solution was continued to stir for one hour. After allowing the reaction solution to cool, it was poured into one liter of ion-exchanged water with vigorous stirring to deposit a white resin. The resin obtained was dried, then dissolved in 100 ml of methanol, and a 25% aqueous solution of tetramethylammonium hydroxide was added thereto to hydrolyze the acetoxy group in the resin. Then, the solution was neutralized with an aqueous solution of hydrochloric acid to deposit a white resin. The resin was washed with ion-exchanged water and dried under a reduced pressure to obtain 11.6 g of Resin (A2–7) according to the present invention. As a result of measurement of molecular weight of the resin by GPC, it was found that a weight average molecular weight (Mw) calculated in terms of polystyrene was 5,500 and a degree of dispersion (Mw/Mn) was 1.45.

The resins of Component (A-2) according to the present invention shown in Table 1 below were synthesized in a similar manner.

(2) Synthesis of Crosslinking Agent of Component (B)

Synthesis Example 2

Synthesis of Crosslinking Agent (HM-1)

To a 10% aqueous solution of potassium hydroxide was added 20 g of 1-[α-methyl-α-(4-hydroxyphenyl)ethyl]-4-[α,α-bis(4-hydroxyphenyl)ethyl]benzene (Trisp-PA manufactured by Honshu Chemical Industry Co., Ltd.) with stirring to dissolve. While stirring the solution, 60 ml of a 37% aqueous formalin solution was gradually added thereto at room temperature over a period of 1 hour. After further stirring at room temperature for 6 hours, the solution was poured into a diluted aqueous sulfuric acid solution. The precipitates thus formed were collected by filtration, sufficiently washed with water, and recrystallized from 30 ml of methanol to obtain 20 g of white powder of phenol derivative (Crosslinking Agent (HM-1)) containing hydroxymethyl groups having the structure shown below. The purity thereof was 92% (determined by a liquid chromatography method).

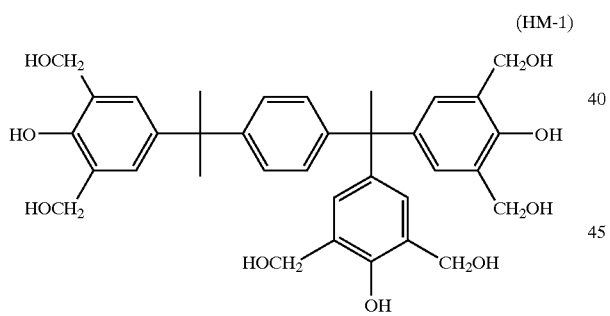
(HM-1)

Synthesis Example 3

Synthesis of Crosslinking Agent (MM-1)

To one liter of methanol was added 20 g of the phenol derivative (Crosslinking Agent (HM-1)) containing hydroxymethyl groups obtained above with heating and stirring to dissolve. To the solution was added 1 ml of concentrated sulfuric acid, and the mixture was refluxed by heating for 12 hours. After the completion of the reaction, the reaction solution was cooled and 2 g of potassium carbonate was added thereto. The mixture was sufficiently concentrated, and 300 ml of ethyl acetate was added thereto. The solution was washed with water and concentrated to dryness to obtained 22 g of phenol derivative (Crosslinking Agent (MM-1)) containing methoxymethyl groups having the structure shown below as a white solid. The purity thereof was 90% (determined by a liquid chromatography method).

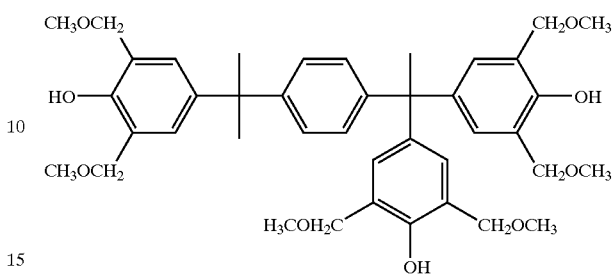
(MM-1)

Furthermore, the phenol derivatives shown below were synthesized in a similar manner.

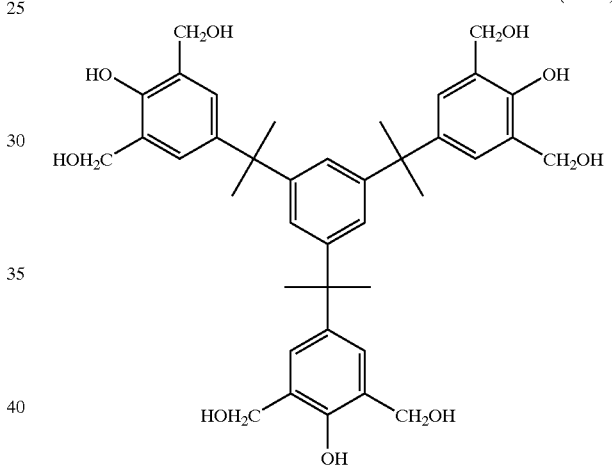
(HM-2)

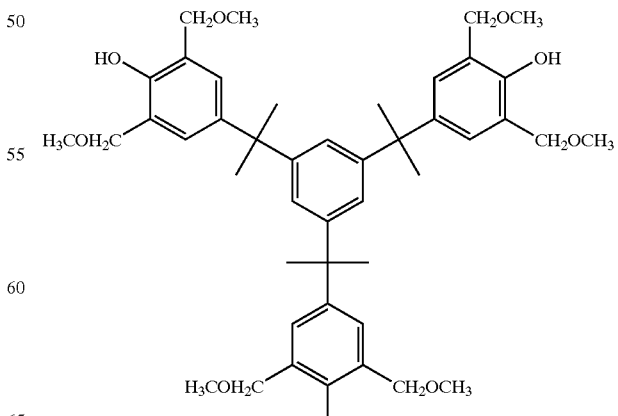
(MM-2)

-continued (HM-3)
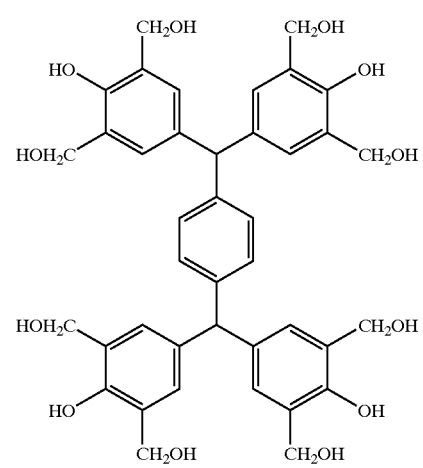

(MM-3)
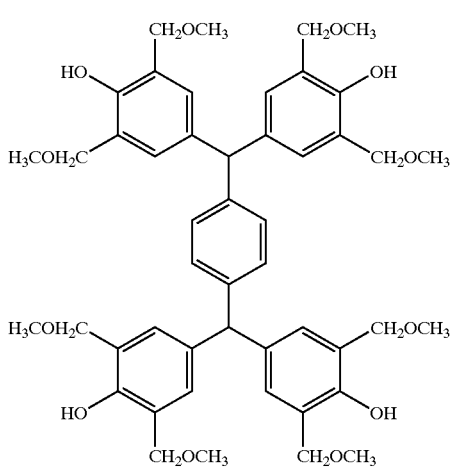

(HM-4)
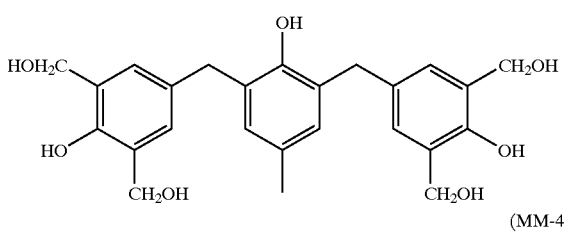

(MM-4)
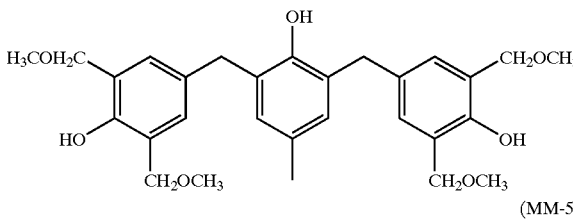

(MM-5)
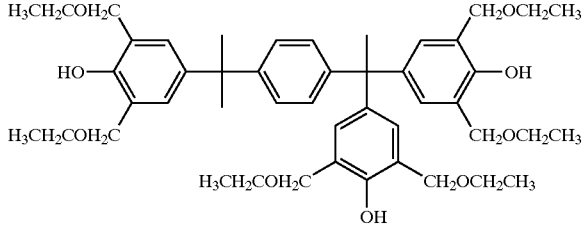

EXAMPLE 1

(1) Preparation and Application of Negative Resist

In a mixed solvent of 6.5 g of propylene glycol monomethyl ether acetate and 2.0 g of propylene glycol monomethyl ether were dissolved 0.60 g of Resin (Al-1) (manufactured by Nippon Soda Co., Ltd.; Mw: 6,000; degree of dispersion: 1.15) of Component (A-1), 0.10 g of Resin (A2–7) of Component (A-1) synthesized in the above synthesis example, 0.25 g of Crosslinking Agent (MM-1) of Component (B) synthesized in the above synthesis example, 0.05 g of Acid Generator (C-1) of Component (C) shown below and 0.005 g of Nitrogen-Containing Basic Compound (D-1) of Component (D) shown below. To the solution was added to dissolve 0.001 g of Megafac F176 (manufactured by Dainippon Ink and Chemicals Inc.) (hereinafter referred to as W-1) as a surface active agent. The resulting solution was subjected to microfiltration using a membrane filter having a pore size of 0.1 μm to prepare a resist solution.

The resist solution was coated on a 6-inch wafer using a spin coater (Mark 8 manufactured by Tokyo Electron Ltd.) and dried at 110° C. for 90 seconds on a hot plate to prepare a resist film having a thickness of 0.3 μm.

(2) Formation and Evaluation of Negative Resist Pattern

The resist film was subjected to pattern irradiation using an electron beam imaging device (HL750 manufactured by Hitachi, Ltd.; acceleration voltage: 50 KeV). After the irradiation, the resist film was heated at 110° C. for 90 seconds on a hot plate, immersed in a 2.38% by weight aqueous solution of tetramethylammonium hydroxide (TMAH) for 60 seconds to develop, rinsed with water for 30 seconds and dried. The pattern thus obtained was evaluated with sensitivity, resolution, pattern profile and development defect in the following manner.

(2-1) Sensitivity

An exposure amount (amount of electron beam irradiation) necessary for resolving 0.15 μm-line (line:space=1:1) was designated as the sensitivity.

(2-2) Resolution

The resolution was expressed using a limiting resolution (line and space being separately resolved) at the exposure amount sufficient for obtaining the above sensitivity.

(2-3) Pattern Profile

A cross-sectional shape of 0.15 μm-line pattern at the exposure amount sufficient for obtaining the above sensitivity was observed using a scanning electron microscope (S-4300 manufactured by Hitachi, Ltd.) and classified into three levels: rectangle, slight taper and taper, for the evaluation.

(2-4) Line Edge Roughness

A line width of the 0.15 μm-line pattern at the exposure amount sufficient for obtaining the above sensitivity was measured in optional 30 points in the area of a length of 50 μm of the line pattern using a scanning electron microscope (S-4300 manufactured by Hitachi, Ltd.), and the variation was evaluated with 3σ.

(2-5) Development Defect

The wafer obtained was observed by an optical microscope and defect on the wafer was determined. Specifically, with a sample obtained by the application, exposure, development and rinse treatment a number of defect was measured (threshold: 12; pixel size: 0.39) using KLA-2112 (manufactured by KLA-Tencor Corp.).

The results of evaluation in Example 1 were good. Specifically, the sensitivity was 6.0 μC/cm$^2$, the resolution was 0.10 μm, the pattern profile was rectangular, the line edge roughness was 4.5 nm, and the number of development defect was very small as 7.

EXAMPLES 2 TO 12

The preparation of resist solutions and formation and evaluation of negative resist patterns were conducted in the same manner as in Example 1 except for using the components shown in Table 1 below. The results of evaluation are shown in Table 2 below.

COMPARATIVE EXAMPLE 1

The preparation of resist solution and formation and evaluation of negative resist pattern were conducted in the same manner as in Example 1 except for using only Resin (A1—1) as shown in Table 1. The results of evaluation are shown in Table 2 below.

COMPARATIVE EXAMPLE 2

The preparation of resist solution and formation and evaluation of negative resist pattern were conducted in the same manner as in Example 2 except for using only Resin (A2-1) as shown in Table 1. The results of evaluation are shown in Table 2 below.

COMPARATIVE EXAMPLE 3

The preparation of resist solution and formation and evaluation of negative resist pattern were conducted in the same manner as in Example 1 except for using Resin (A1—2) of Component (A-1) in combination with Resin (A1—1) as shown in Table 1. The results of evaluation are shown in Table 2 below.

COMPARATIVE EXAMPLE 4

The preparation of resist solution and formation and evaluation of negative resist pattern were conducted in the same manner as in Example 1 except for using Resin (A2–1) of Component (A-2) in combination with Resin (A2–7) as shown in Table 1. The results of evaluation are shown in Table 2 below.

TABLE 1

| Example | Resin of Component (A-1) | Resin of Component (A-2) | Acid Generator of Component (C) | Crosslinking Agent of Component (B) | Nitrogen-Containing Basic Compound of Component (D) | Surface Active Agent (0.001 g) |
|---|---|---|---|---|---|---|
| 1 | A1-1 0.60 g<br>Mw = 6,000<br>Mw/Mn = 1.15 | A2-7 0.10 g<br>Mw = 5,500<br>x/y = 80/20<br>Mw/Mn = 1.45 | C-1<br>0.05 g | MM-1<br>0.25 g | D-1<br>0.005 g | W-1 |
| 2 | A1-1 0.55 g<br>Mw = 4,000<br>Mw/Mn = 1.08 | A2-1 0.15 g<br>Mw = 5,000<br>Mw/Mn = 1.10 | C-1<br>0.05 g | MM-1<br>0.25 g | D-1<br>0.005 g | W-1 |
| 3 | A1-2 0.40 g<br>Mw = 4,500<br>Mw/Mn = 1.25 | A2-2 0.30 g<br>Mw = 3,000<br>Mw/Mn = 1.22 | C-1<br>0.05 g | MM-1<br>0.25 g | D-2<br>0.003 g | W-1 |
| 4 | A1-5 0.55 g<br>Mw = 5,500<br>Mw/Mn = 1.35 | A2-8 0.15g<br>Mw = 7,000<br>x/y = 90/10<br>Mw/Mn = 1.53 | C-2<br>0.05 g | MM-1<br>0.25 g | D-1<br>0.005 g | W-1 |
| 5 | A1-6 0.20 g<br>Mw = 4,000<br>Mw/Mn = 1.13 | A2-7 0.50 g<br>Mw = 3,000<br>x/y = 95/5<br>Mw/Mn = 1.35 | C-1<br>0.05 g | MM-2<br>0.25 g | D-2<br>0.003 g | W-1 |
| 6 | A1-1 0.60 g<br>Mw = 6,000<br>Mw/Mn = 1.15 | A2-12 0.10 g<br>Mw = 5,000<br>x/y = 90/10<br>Mw/Mn = 1.18 | C-1<br>0.05 g | MM-3<br>0.25 g | D-2<br>0.004 g | W-1 |
| 7 | A1-1 0.40 g<br>Mw = 6,000<br>Mw/Mn = 1.15 | A2-13 0.30 g<br>Mw = 7,000<br>x/y = 85/15<br>Mw/Mn = 1.24 | C-3<br>0.05 g | MM-4<br>0.30 g | D-3<br>0.004 g | W-1 |
| 8 | A1-7 0.50 g<br>Mw = 5,000<br>x/y = 90/10<br>Mw/Mn = 1.28 | A2-5 0.20 g<br>Mw = 4,500<br>Mw/Mn = 1.45 | C-3<br>0.05 g | MM-5<br>0.30 g | D-1<br>0.005 g | W-2 |
| 9 | A1-8 0.30 g<br>Mw = 7,500<br>x/y= 90/10<br>Mw/Mn = 1.50 | A2-11 0.40 g<br>Mw = 3,000<br>x/y = 85/15<br>Mw/Mn = 1.65 | C-2<br>0.05 g | MM-1<br>0.25 g | D-3<br>0.004 g | W-2 |
| 10 | A1-10<br>0.25 g<br>Mw = 3,500<br>x/y = 70/30<br>Mw/Mn = 1.65 | A2-9 0.45 g<br>Mw = 4,500<br>x/y = 90/10<br>Mw/Mn = 1.15 | C-3<br>0.05 g | MM-2<br>0.25 g | D-1<br>0.005 g | W-2 |
| 11 | A1-11<br>0.55 g<br>Mw = 7,000<br>x/y = 90/10<br>Mw/Mn = 1.25 | A2-1 0.15 g<br>Mw = 5,000<br>Mw/Mn = 1.10 | C-1<br>0.05 g | MM-5<br>0.25 g | D-2<br>0.003 g | W-2 |

TABLE 1-continued

| | Resin of Component (A-1) | Resin of Component (A-2) | Acid Generator of Component (C) | Crosslinking Agent of Component (B) | Nitrogen-Containing Basic Compound of Component (D) | Surface Active Agent (0.001 g) |
|---|---|---|---|---|---|---|
| 12 | A1-15 0.45 g<br>Mw = 6,500<br>x/y = 90/10<br>Mw/Mn = 1.10 | A2-1 0.25g<br>Mw = 5,000<br>Mw/Mn = 1.10 | C-1 0.05 g | MM-4 0.25 g | D-3 0.004 g | — |
| Comparative Example | | | | | | |
| 1 | A1-1 0.60 g<br>Mw = 6,000<br>Mw/Mn = 1.15 | — | C-1 0.05 g | MM-1 0.25 g | D-1 0.005 g | W-1 |
| 2 | — | A2-1 0.15 g<br>Mw = 5,000<br>Mw/Mn = 1.10 | C-1 0.05 g | MM-1 0.25 g | D-1 0.005 g | W-1 |
| 3 | A1-1 0.50 g<br>Mw = 6,000<br>Mw/Mn = 1.15<br>A1-2 0.20 g<br>Mw = 4,500<br>Mw/Mn = 1.25 | — | C-1 0.05 g | MM-1 0.25 g | D-1 0.005 g | W-1 |
| 4 | — | A2-7 0.10 g<br>Mw = 5,500<br>x/y = 80/20<br>Mw/Mn = 1.45<br>A2-1 0.15 g<br>Mw = 5,000<br>Mw/Mn = 1.10 | C-1 0.05 g | MM-1 0.25 g | D-1 0.005 g | W-1 |

The acid generators used in Table 1 are shown below.
C-1: Triphenylsulfonium nonafluorobutanesulfonate
C-2: Bis(4,4'-di-tret-amyl)phenyliodonium nonafluorobutanesulfonate
C-3: N-Pentafluorobenzenesulfonyloxyphthalimide
The nitrogen-containing basic compounds used in Table 1 are shown below.

D-1: 1,5-Diazabicyclo[4.3.0]non-5-ene (manufactured by Tokyo Kasei Kogyo Co., Ltd.)
D-2: 2,4,5-Triphenylimidazole (manufactured by Tokyo Kasei Kogyo Co., Ltd.)
D-3: 4-Dimethylaminopyridine (manufactured by Tokyo Kasei Kogyo Co., Ltd.)
The surface active agents used in Table 1 are shown below.
W-1: Megafac F176 (manufactured by Dainippon Ink and Chemicals, Inc.)
W-2: Siloxane polymer KP341 (manufactured by Shin-Etsu Chemical Co., Ltd.)

TABLE 2

| | Sensitivity ($\mu C/cm^2$) | Resolution ($\mu m$) | Pattern Profile (three-level evaluation) | Line Edge Roughness (nm) | Development Defect (number) |
|---|---|---|---|---|---|
| Example 1 | 6.0 | 0.10 | Rectangle | 4.5 | 7 |
| Example 2 | 5.0 | 0.11 | Rectangle | 5.5 | 4 |
| Example 3 | 6.5 | 0.11 | Slight Taper | 4.0 | 9 |
| Example 4 | 6.5 | 0.10 | Rectangle | 6.0 | 3 |
| Example 5 | 4.5 | 0.10 | Rectangle | 4.5 | 8 |
| Example 6 | 5.0 | 0.10 | Rectangle | 5.5 | 7 |
| Example 7 | 5.5 | 0.09 | Rectangle | 5.0 | 6 |
| Example 8 | 5.5 | 0.11 | Rectangle | 5.0 | 6 |
| Example 9 | 5.0 | 0.10 | Rectangle | 4.0 | 5 |
| Example 10 | 6.0 | 0.10 | Rectangle | 4.5 | 10 |
| Example 11 | 5.0 | 0.10 | Rectangle | 5.5 | 9 |
| Example 12 | 5.5 | 0.11 | Rectangle | 5.0 | 4 |
| Comparative Example 1 | 5.0 | 0.12 | Rectangle | 11.5 | 125 |
| Comparative Example 2 | 9.0 | 0.14 | Slight Taper | 13.0 | 3 |
| Comparative Example 3 | 5.5 | 0.12 | Rectangle | 10.5 | 95 |
| Comparative Example 4 | 10.5 | 0.15 | Slight Taper | 12.5 | 7 |

From the results shown in Table 2, it can be seen that the negative resist compositions of the present invention are excellent in the sensitivity, resolution, pattern profile, line edge roughness and development defect property, and thus have good performances.

According to the present invention, the negative resist composition excellent in the sensitivity, resolution, pattern profile, line edge roughness and development defect property can be provided.

The entire disclosure of each and every foreign patent application from which the benefit of foreign priority has been claimed in the present application is incorporated herein by reference, as if fully set forth herein.

While the invention has been described in detail and with reference to specific examples thereof, it will be apparent to one skilled in the art that various changes and modifications can be made therein without departing from the spirit and scope thereof.

What is claimed is:

1. A negative resist composition comprising (A-1) an alkali-soluble resin containing a repeating unit represented by formula (1) shown below, (A-2) an alkali-soluble resin containing a repeating unit represented by formula (2) shown below, (B) a crosslinking agent crosslinking with the alkali-soluble resin (A-1) or (A-2) by the action of an acid, (C) a compound that generates an acid upon irradiation of an actinic ray or radiation, and (D) a nitrogen-containing basic compound

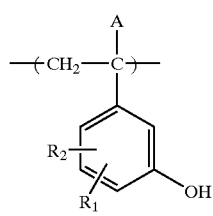
(1)

wherein A represents a hydrogen atom, an alkyl group, a halogen atom or a cyano group; and $R_1$ and $R_2$ each independently represent a hydrogen atom, a halogen atom, a hydroxy group, an alkyl group, an alkenyl group, a cycloalkyl group, an aryl group, an aralkyl group, an alkoxy group, an alkylcarbonyloxy group or an alkylsulfonyloxy group, or $R_1$ and $R_2$ may be combined with each other to form a ring

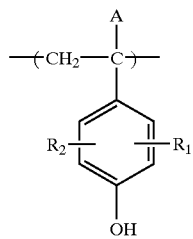
(2)

wherein, A, $R_1$ and $R_2$ have the same meanings as A, $R_1$ and $R_2$ defined in formula (1) respectively, provided that the alkali-soluble resin (A-2) has the structure different from that of the alkali-soluble resin (A-1).

2. The negative resist composition as claimed in claim 1, wherein the alkali-soluble resin (A-1) contains a repeating unit represented by formula (1) and at least one repeating unit selected from repeating units represented by formulae (3), (4) and (5) shown below

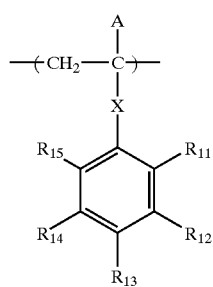
(3)

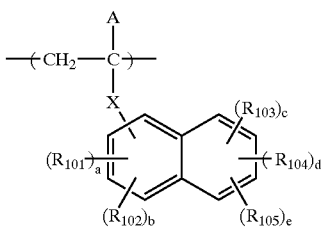
(4)

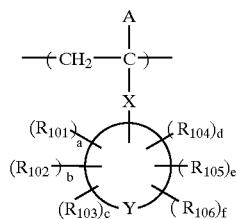
(5)

wherein,

represents a ring structure selected from the following structures:

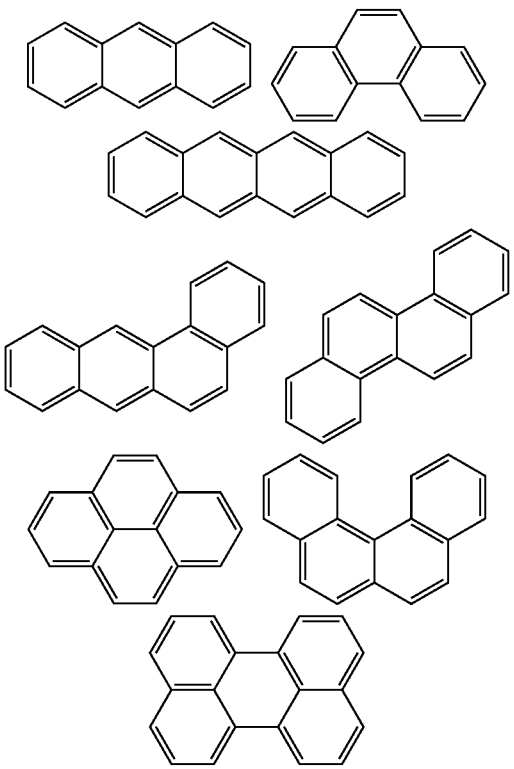

A has the same meaning as A defined in formula (1); X represents a single bond, —COO—, —O— or —CON($R_{16}$)—; $R_{16}$ represents a hydrogen atom or an alkyl group; $R_{11}$ to $R_{15}$ each independently have the same meanings as $R_1$ defined in formula (1); $R_{101}$ to $R_{106}$ each independently represent a hydrogen atom, a hydroxy group, a halogen atom, an alkyl group, an alkoxy group, an alkylcarbonyloxy group, an alkylsulfonyloxy group, an alkenyl group, an aryl group, an aralkyl group or a carboxy group; and a to f each independently represent an integer of from 0 to 3.

3. The negative resist composition as claimed in claim 1, wherein the alkali-soluble resin (A-2) contains a repeating unit represented by formula (2) and at least one repeating unit selected from repeating units represented by formulae (3), (4) and (5) shown below

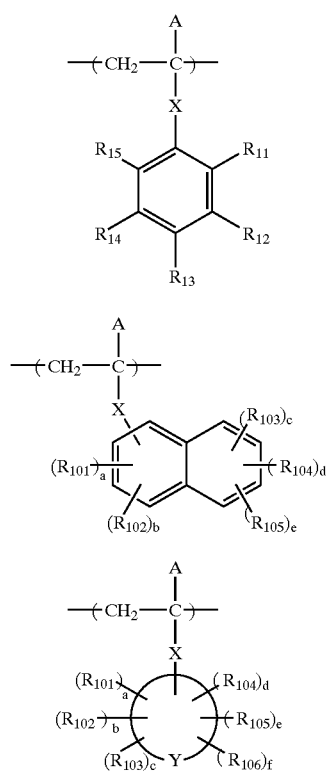

wherein,

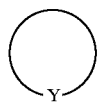

represents a ring structure selected from the following structures:

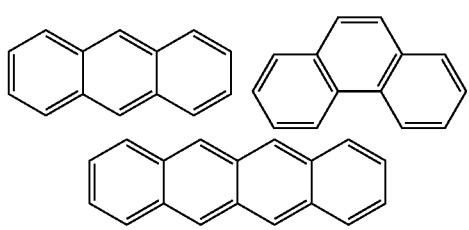

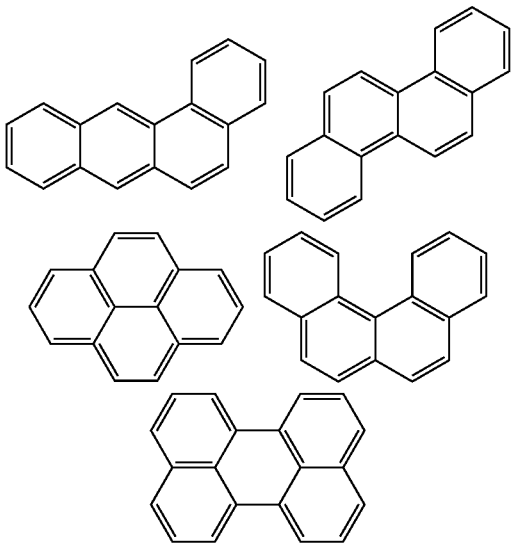

A has the same meaning as A defined in formula (1); X represents a single bond, —COO—, —O— or —CON($R_{16}$)—; $R_{16}$ represents a hydrogen atom or an alkyl group; $R_{11}$ to $R_{15}$ each independently have the same meanings as $R_1$ defined in formula (1); $R_{101}$ to $R_{106}$ each independently represent a hydrogen atom, a hydroxy group, a halogen atom, an alkyl group, an alkoxy group, an alkylcarbonyloxy group, an alkylsulfonyloxy group, an alkenyl group, an aryl group, an aralkyl group or a carboxy group; and a to f each independently represent an integer of from 0 to 3.

4. The negative resist composition as claimed in claim 1, wherein the crosslinking agent (B) is a phenol compound that has at least two benzene rings and does not contain a nitrogen atom.

5. The negative resist composition as claimed in claim 1, which further comprises a surface active agent.

6. The negative resist composition as claimed in claim 1, wherein the crosslinking agent (B) is a phenol derivative having a molecular weight of not more than 1,200, containing from 3 to 5 benzene rings in the molecule thereof, and having at least two groups selected from a hydroxymethyl group and an alkoxymethyl group, wherein the hydroxymethyl group and alkoxymethyl group are concentrically connected to one of the benzene rings or dispersedly connected to two or more of the benzene rings.

7. The negative resist composition as claimed in claim 1, wherein the crosslinking agent (B) is a compound having an N-hydroxymethyl group, an N-alkoxymethyl group or an N-acyloxymethyl group.

8. The negative resist composition as claimed in claim 1, wherein the crosslinking agent (B) is an epoxy compound.

9. The negative resist composition as claimed in claim 1, wherein the compound (C) that generates an acid upon irradiation of an active ray or radiation is a compound selected from an onium salt, an organic halogen compound, an organic metal/organic halogen compound, a photo-acid generator having an o-nitrobenzyl type protective group, a compound generating a sulfonic acid upon photolysis, a disulfone compound, a diazoketosulfone compound and a diazosulfone compound.

10. The negative resist composition as claimed in claim 1, which further comprises a solvent.

* * * * *